(12) United States Patent  
Lindgren

(10) Patent No.: US 8,431,484 B2
(45) Date of Patent: *Apr. 30, 2013

(54) STABLE ELECTROLESS FINE PITCH INTERCONNECT PLATING

(75) Inventor: Joseph T. Lindgren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/079,364

(22) Filed: Apr. 4, 2011

(65) Prior Publication Data

US 2011/0183514 A1  Jul. 28, 2011

Related U.S. Application Data

(63) Continuation of application No. 11/402,924, filed on Apr. 13, 2006, now abandoned, which is a continuation of application No. 10/622,497, filed on Jul. 21, 2003, now Pat. No. 7,052,922.

(51) Int. Cl.
  *H01L 21/44* (2006.01)
(52) U.S. Cl.
  USPC ............. 438/652; 438/612; 438/678; 257/48; 257/741; 257/766; 257/E21.174; 257/E21.477
(58) Field of Classification Search ............... None
  See application file for complete search history.

(56) References Cited

U.S. PATENT DOCUMENTS

| 5,209,817 | A | * | 5/1993 | Ahmad et al. ............... 216/18 |
| 5,260,220 | A | | 11/1993 | Dougherty et al. |
| 5,484,626 | A | | 1/1996 | Storjohann et al. |
| 5,972,116 | A | | 10/1999 | Takagi |
| 5,994,915 | A | | 11/1999 | Farnworth et al. |
| 6,060,176 | A | * | 5/2000 | Semkow et al. ............. 428/620 |
| 6,245,389 | B1 | | 6/2001 | Horikawa et al. |
| 6,335,626 | B1 | | 1/2002 | Motulla |
| 6,350,633 | B1 | * | 2/2002 | Lin ............................. 438/113 |
| 6,362,089 | B1 | | 3/2002 | Molla et al. |
| 6,505,634 | B2 | | 1/2003 | Son et al. |
| 6,660,626 | B1 | * | 12/2003 | Lin ............................. 438/618 |
| 6,709,561 | B1 | * | 3/2004 | Pavlov et al. .................. 205/81 |
| 6,709,980 | B2 | | 3/2004 | Gleason |
| 6,764,879 | B2 | | 7/2004 | Nagao et al. |
| 6,774,039 | B1 | | 8/2004 | Drewery |
| 6,841,476 | B1 | | 1/2005 | Nakamura |
| 6,953,951 | B2 | | 10/2005 | Yamazaki et al. |
| 2003/0219976 | A1 | | 11/2003 | Gleason |

* cited by examiner

*Primary Examiner* — Telly Green
*Assistant Examiner* — Khanh Duong
(74) *Attorney, Agent, or Firm* — Dickstein Shapiro LLP

(57) ABSTRACT

A method and apparatus for plating facilitates the plating of a small contact feature of a wafer die while providing a relatively stable plating bath. The method utilizes a supplemental plating structure that is larger than a die contact that is to be plated. The supplemental plating structure may be located on the wafer, and is conductively connected to the die contact. Conductive connection between the die contact and the supplemental plating structure facilitates the plating of the die contact. The supplemental plating structure also can be used to probe test the die prior to singulation.

14 Claims, 3 Drawing Sheets

US 8,431,484 B2

STABLE ELECTROLESS FINE PITCH INTERCONNECT PLATING

This application is a continuation of U.S. patent application Ser. No. 11/402,924, filed Apr. 13, 2006 now abandoned, which is a continuation of U.S. patent application Ser. No. 10/622,497, filed Jul. 21, 2003 now U.S. Pat. No. 7,052,922, the subject matter of each being incorporated in their entirety by reference herein.

FIELD OF THE INVENTION

The invention relates to apparatus and techniques for plating small surface features of an integrated circuit device.

BACKGROUND OF THE INVENTION

As integrated circuit devices become increasingly complex and feature sizes become increasingly smaller, it becomes more difficult to plate conductive metals onto the very fine pitch features. For example, bond pads formed on dies require plating to form die contacts. Improper or incomplete plating of the bond pads results in die contacts having poor solderability, which decreases yield. Also, it can be difficult to maintain the stability of baths in which parts of various sizes are plated. Consequently, a system for plating small die features, using a stable plating bath, is desired.

BRIEF SUMMARY OF THE INVENTION

The present invention provides an integrated circuit plating apparatus having a bath for plating die contacts on wafers. Prior to plating, die contacts are conductively connected to larger supplemental plating structures on the wafer. Initiating a plating reaction on the larger supplemental plating structures inductively activates plating on the smaller die contacts. The supplemental plating structures are sacrificed during subsequent processing. Advantageously, the supplemental plating structures also can be used for probe testing prior to die singulation.

The invention further provides a method of plating die contacts of a plurality of dice (chips) on a wafer, which includes fabricating the larger supplemental plating structures on the wafer, fabricating a conductive connection between the supplemental plating structures and the die contacts, maintaining a plating bath, inserting the wafer into the plating bath, and plating the supplemental plating structures and die contacts. Plating of the die contacts is induced as a result of the conductive connection to the supplemental plating structures. The method and apparatus facilitate the plating of a small contact feature of a wafer die while providing a relatively stable plating bath.

These and other features of the invention will be seen more clearly from the following detailed description of the invention which is provided in connection with the accompanying drawings.

DETAILED DESCRIPTION OF PREFERRED EMBODIMENTS

Figure 1:
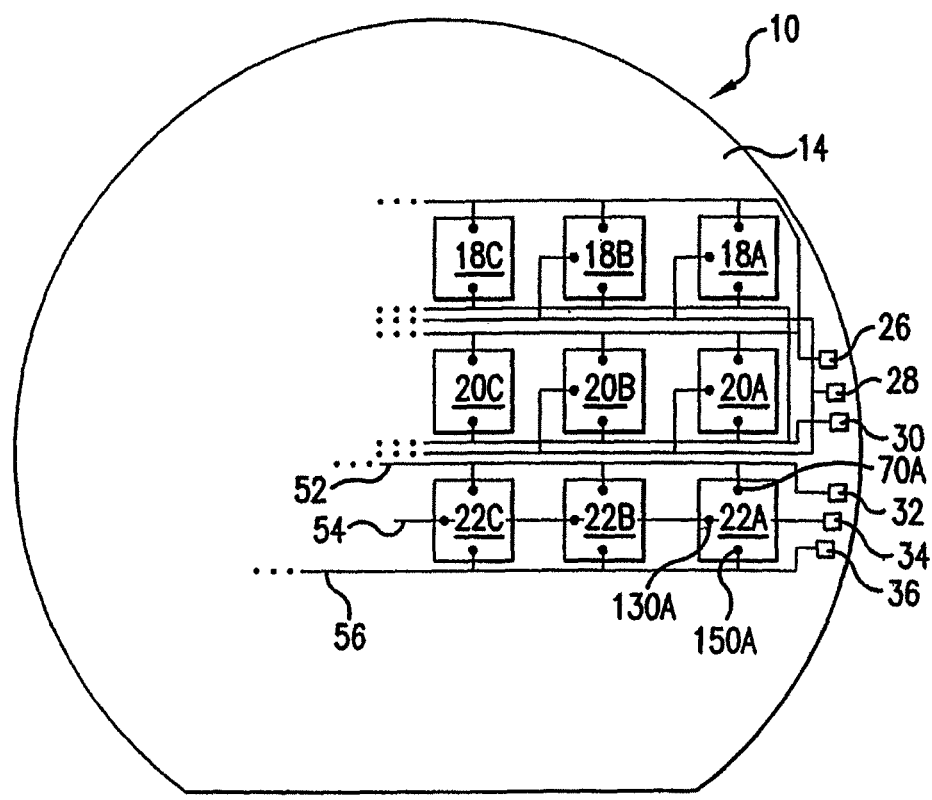
FIG. 1 is a schematic top view of a semiconductor wafer in one embodiment of the present invention.

Referring to FIG. 1, a semiconductor wafer 10 fabricated in accordance with an exemplary embodiment of the invention includes a substrate 14 on which numerous dice are formed through etching, deposition, and other integrated circuit (IC) fabrication techniques. The substrate 14 may be formed of a variety of semiconductor materials known in the art including silicon and gallium-arsenide, among others. The wafer 10 is not limited to any particular size or shape.

Each wafer 10 includes many dice. For clarity of illustration, only dice 18A-C, 20A-C, and 22A-C (collectively "dice 18-22") are shown in FIG. 1. The dice are fabricated in the aggregate on wafer 10, and after fabrication are singulated from wafer 10 using a cutting process, for example. The separation takes place along the areas between adjacent dice, the so-called "street" areas.

Figure 2:
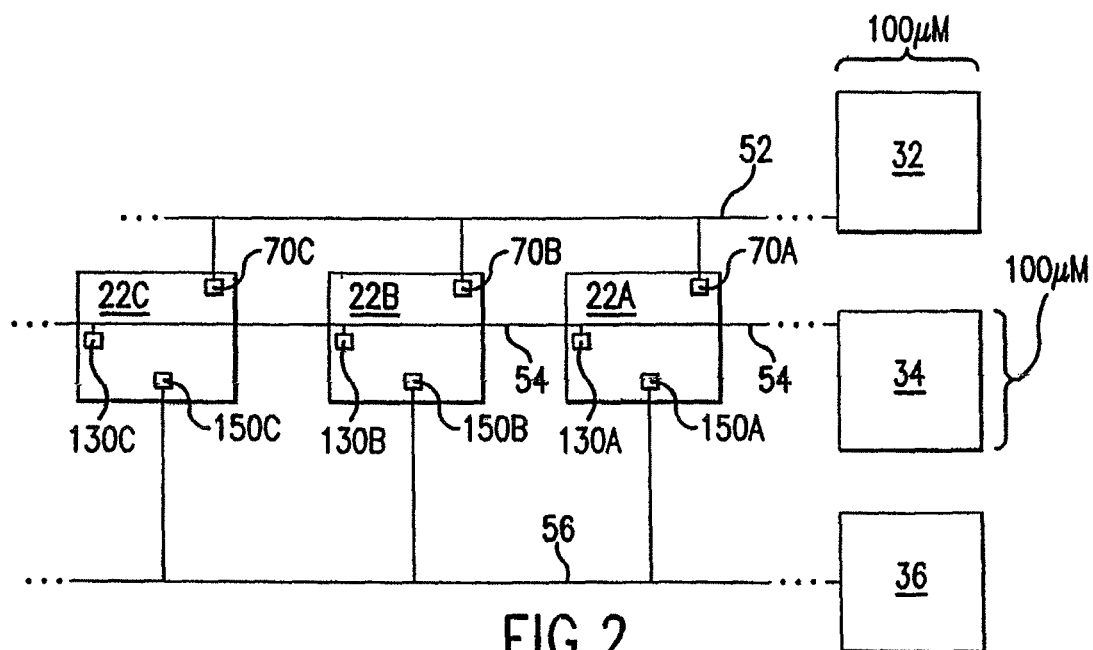
FIG. 2 shows in enlarged detail a portion of FIG. 1.

FIG. 2 shows a portion of the die 22 in greater detail. Small bond pads, e.g., 70A, 130A, 150A, are provided on each die. The bond pads require plating with a conductive metal to form die contacts. Once the bond pad is plated, the die contact is available for subsequent bonding of solder or wire to each die, e.g., 22A. The bond pads/die contacts 70A, 130A, 150A can be square and measure approximately 5 micrometers (μm) or less on a side, although other shapes and dimensions can be used. As stated above, using conventional techniques to plate features having such small dimensions can be difficult. It also is difficult to probe such small features during die testing prior to singulation.

In accordance with the exemplary embodiment, plating of the small die contacts 70, 130, 150 of each die is promoted by forming conductive connections between the die contacts and a larger supplemental plating structure provided on the wafer 10. For example, as shown in FIGS. 1 and 2, each of the die contacts 70A, 70B, 70C is commonly conductively connected to a larger supplemental plating structure 32. Similarly, the die contacts 130A, 130B, 130C are conductively connected to a larger supplemental plating structure 34, and die contacts 150A, 150B, 150C are conductively connected to a larger supplemental plating structure 36. Subsequent manufacturing steps include plating the supplemental plating structures at the time the die contacts are plated, which promotes plating of the die contacts 70A-C, 130A-C, 150A-C. Advantageously, the supplemental plating structures 26, 28, 30, 32, 34, 36 also can be used for probe testing the dice prior to singulation.

As shown in FIG. 2, the supplemental plating structures, e.g., 32, 34 can be square in shape with each side measuring approximately 100 μm. Other suitable shapes and dimensions can be used. In one example, the die contacts are square with a side length of 5 μm, and the supplemental plating structures are square with a side length of 100 μm. In the aforementioned example, the surface area of the supplemental plating structure is about 400 times as large as the surface area of a corresponding die contact.

The supplemental plating structures 26, 28, 30, 32, 34, 36 are positioned about the wafer 10 such that the total number of dice on wafer 10 either is not reduced at all, or is reduced by a minimum amount by addition of the supplemental plating structures 26, 28, 30, 32, 34, 36. The supplemental plating structures 26, 28, 30, 32, 34, 36 may be placed, for example, along the edge of wafer 10 where there is available space, resulting from the round shape of wafer 10 and the non-round shape of the dice array. In another embodiment, the supplemental plating structures 26, 28, 30, 32, 34, 36 may be located in the dicing lanes, i.e., the so-called "street" areas, between the dice.

FIG. 2 also shows conductive paths 52, 54, 56 used to connect the supplemental plating structures 26, 28, 30, 32, 34, 36 and the die contacts, routed in the streets and on the edges of the wafer 10. During the singulation process, the supplemental plating structures 26, 28, 30, 32, 34, 36 are sacrificed, and subsequently discarded. Also, streets and conductive paths arranged in the streets no longer are needed, and can be cut and discarded.

Since the conductive paths and supplemental plating structures can be sacrificed, these sacrificial features may be removed prior to, or at, die singulation. Accordingly, conductive paths and supplemental plating structures can be routed on top of the dice, provided that such routing does not interfere with the plating of the die contacts. Conductive path 54 is shown routed over die 22 in FIG. 2. Such sacrificial features preferably are removed prior to, or at, singulation, such as by planarization, for example.

Referring again to FIG. 1, each of the supplemental plating structures 26, 28, and 30 is connected to two sets of dice (i.e., 18A-C and 20A-C). By contrast, other supplemental plating structures 32, 34, and 36, are connected only to one set of dice (i.e., 22A-C). The number of dice or die contacts connected to a particular supplemental plating structures is not limited to the illustrated arrangement. In the event that the supplemental plating structures are used as probe pads, however, one particular die contact typically will be connected to one supplemental plating structure. A plurality of die contacts for which probe testing is not necessary can be commonly connected electrically to a single supplemental plating structure of sufficient area to promote plating on the die contacts.

Once the respective die contacts and supplemental plating structures are conductively connected, the wafer 10 is subjected to electroless plating. In plating processes in general, an oxidation-reduction reaction takes place in which suspended metal ions are reduced (i.e., gain electrons) in conjunction with a concomitant oxidation reaction (i.e., a reaction in which electrons are lost). The reduced metal deposits onto a surface, thereby plating the surface. In such a plating process, the rate of the plating reaction is determined in general by the bath temperature and the chelate concentration (i.e., the free metal concentration). Thus, the aforementioned plating process is not a diffusion-limited process, and the rate of reaction is independent of the size of the feature to be plated.

The electroless plating process of the present invention is a chemical reduction process which depends upon the catalytic reduction of metal ions in an aqueous solution (containing a chemical reducing agent), and the subsequent deposition of metal without the use of electrical energy. In the electroless plating process, instead of the use of electrical energy as the driving force for the reduction of metal ions and their deposition, the driving force is supplied by the chemical reducing agent in solution.

Figure 3:
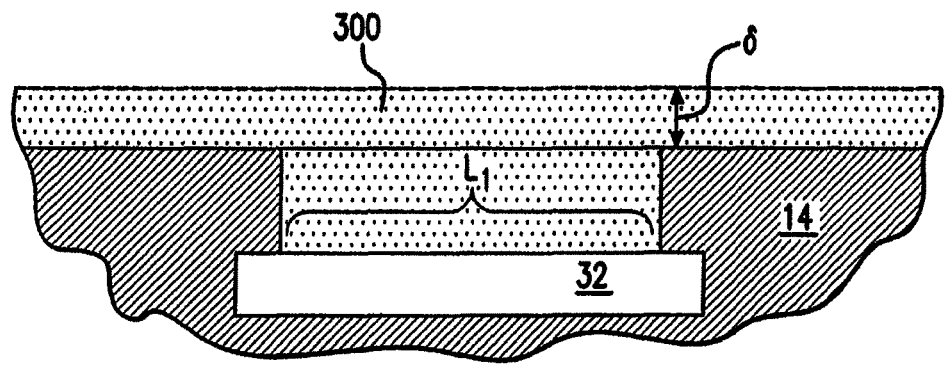
FIG. 3 illustrates linear diffusion in an electroless plating bath.

FIG. 3 shows the supplemental plating structure 32 being subjected to electroless plating in the plating bath 300. The plating bath 300 includes a nickel salt, such as, for example, nickel sulfate ($NiSO_4$); a hypophosphite salt, such as, for example, sodium hypophosphite ($NaH_2PO_2$) or ammonium hypophosphite ($NH_4H_2PO_2$); an organic acid or a chelating agent; and a stabilizer, such as, for example, Pb, Cd, or $CH_4N_2S$. Additional possible stabilizers are described below. During the plating process, the hypophosphite salts are oxidized (i.e., lose electrons) while the $Ni^{2+}$ ions contained in the bath are reduced (i.e., gain electrons). During plating, $Ni^{2+}$ ions in the plating bath 300 are reduced, and nickel metal is deposited, i.e., plated, on the surface of supplemental plating structure 32.

Figure 4:
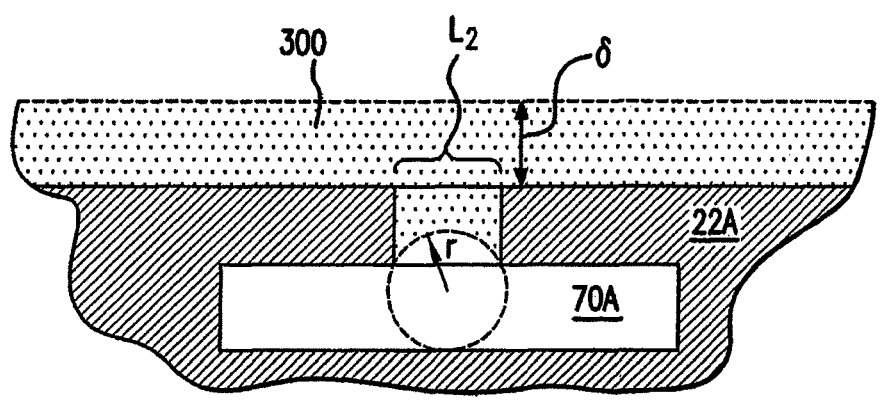
FIG. 4 illustrates non-linear diffusion in an electroless plating bath.

FIG. 4 shows the die 22A having the die contact 70A being subjected to electroless plating in the plating bath 300. During plating, $Ni^{2+}$ ions in the plating bath 300 are reduced, and nickel metal is deposited, i.e., plated, on the surface of die contact 70A.

As discussed in greater detail below, a metal such as nickel can catalyze its own reduction. That is, the nickel metal itself has sufficient catalytic activity to oxidize hypophosphite salts such as those used within the bath 300. Such autocatalysis leads to the reduction of nickel ions in the bath, and thus the formation of nickel metal in the bath 300 instead of depositing on the surfaces that are to be plated. Therefore, the aforementioned stabilizer is required to prevent an autocatalytic, "runaway" (i.e., out-of-control) reaction. The stabilizer occupies reactive sites on the nickel surface, thereby physically preventing the solid metal surface from autocatalyzing a runaway reduction reaction. Because the stabilizer surface adsorbs, the rate of adsorption is dependent on flow rate and feature size. As flow rate increases, and/or size decreases, the rate of adsorption increases. Thus, the mechanism of an inhibition reaction that uses a stabilizer is diffusion limited and feature size dependent.

Figure 5:
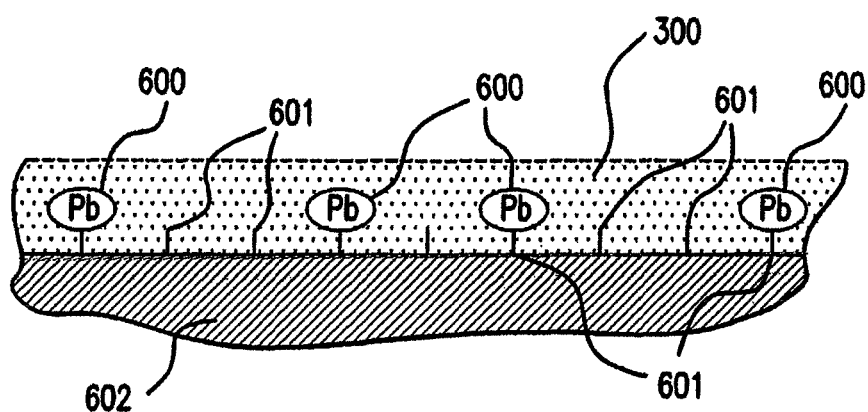
FIG. 5 is a cross-sectional view of a solid catalytic surface to depict the inhibition reaction mechanism associated with the use of a stabilizer in an electroless plating bath.

FIG. 5 is a cross-sectional view of a solid catalytic surface, and depicts the inhibition reaction mechanism associated with the use of a stabilizer in an electroless plating bath. As shown in FIG. 5, a stabilizer 600 (such as Pb) provided in the bath 300 is a surface adsorbing agent that inhibits the electroless reduction reaction by physically occupying various active sites 601 on a solid catalytic surface 602 that could initiate plating, such as the surface of a particle (e.g., nickel, palladium, dust, etc.) in the plating bath.

A stabilizer prevents runaway plating reactions, but at excess concentration levels the stabilizer 600 will occupy too many reactions sites, and will arrest plating in the bath altogether. Stabilizers surface adsorb, and the rate of adsorption is dependent on flow rate and feature size. Adsorption is directly proportional to concentration and flow rate, and is dependent on diffusion mode (i.e., linear or non-linear.) Thus, as the concentration and flow rate of the plating bath increase, the rate of adsorption increases. As a result, small-sized features easily become completely inhibited from plating in a bath with excess stabilizer. Determining the correct stabilizer concentration in a bath is related to the size of the features to be plated. Plating inhibition on smaller features can be reduced by reducing the amount of stabilizer in the solution, but only at the expense of plating bath stability.

Referring again to FIG. 3, the effective length $L_1$ of the supplemental plating structure 32 is substantially larger than the boundary layer thickness (i.e., diffusion transport distance) δ. As a result, linear diffusion of stabilizer takes place on the supplemental plating structures. By contrast, referring to FIG. 4, the radius r associated with die contact 70A is of the same approximate magnitude as the distance $L_2$. Accordingly, diffusion to the die contacts is non-linear.

It is important to note that the oxidation of a hypophosphite salt (e.g., $NaH_2PO_2$) can only occur with catalytically-active particles, such as palladium or nickel. As noted above, once nickel plating is initiated, plating will continue to occur because the nickel metal itself has sufficient catalytic activity to oxidize hypophosphite salts such as those used within the bath 300. Such runaway plating is undesirable, however, because it can quickly reduce the nickel ions present in the plating bath 300 to particles of nickel metal. These nickel particles summed together can constitute an enormous amount of surface area, and can destroy the plating bath by combining with the hypophosphite salts rather than diffusing to the surface of the bond pads to be plated.

In addition, the nickel particles can attach to the sides of the plating tank and associated plumbing. Should a plating bath enter a runaway state, it cannot be used and must be discarded. Also, any remnants of nickel left in the tank would then continue to be catalytic centers for plating in any new plating bath that was placed in the tank. Thus, the tank and plumbing would need to be cleaned in order to purge all nickel remnants from the tank. Such purging generally is done using 20-30% nitric acid.

The possibility of spontaneous reduction of nickel in the bath 300 can be mitigated by the use of stabilizers, such as those discussed above in connection with FIG. 5. The size of the particle that can be neutralized is generally determined by the concentration of the stabilizer 600 within the bath 300. As increasing amounts of stabilizer 600 are added to the bath 300, increasingly larger particles are inhibited, and thus can be prevented from being catalytically active sites. This is true not only for free particles in solution, but also for those areas on the die for which plating is desired. The size dependency for conductive areas is related to the linear and non-linear diffusion modes discussed above.

The size dependency related to diffusion modes makes for difficulty in effective stabilization of a plating bath to be used for multi-sized surfaces. The impact of stabilizer reaching the conductive areas is much greater for small areas than for large areas. Once the amount of stabilizer diffusing to the surface of a conductive area (either large or small) to be plated becomes sufficiently large, the plating reaction will be chemically inhibited and will cease of its own accord. Thus, in a given plating bath it may be possible to plate areas measuring 100 µm on a side, but not those measuring 30 µm on a side. Accordingly, a compromise exists between overall bath stability and the size of the conductive area to be plated.

The present invention solves the aforementioned and other problems with its ability to plate small features, such as die contacts 70A-C, yet still have a relatively stable plating bath 300, by temporarily conductively connecting the bond pads 32, 34, 36 to the larger supplemental plating structures as shown in FIG. 2. Because the die contacts, such as 70A-C, and supplemental plating structures 32, 34, 36 are conductively connected, $Ni^{2+}$ is reduced to form the die contact via oxidation of hypophosphite on the supplemental plating structures. Additionally, the plating reaction, once initiated, becomes self-sustaining on both the supplemental plating structures 32, 34, 36 and the bond pads/die contacts 70A-C.

A typical plating reaction does not occur instantly, but requires an initiation process to overcome the reaction threshold. During the time required to complete the initiation there is ample opportunity for stabilizer 600 to diffuse to the surface of an area to be plated and thus inhibit the plating reaction from occurring. Once this initial threshold is overcome and plating is initiated, however, the plating rate is sufficient that the rate of diffusion of stabilizer is insufficient to stop the plating reactions. Given a sufficient supply of plating bath, the plating process reaches completion only when there are no more areas on the surface which can be paired with the nickel ions. In effect, therefore, the plating process does not stop until the wafer is removed from the bath. The nickel ions not used in the plating process remain in the plating bath 300, but because of the presence of stabilizer 600, the nickel ions do not react with the hypophosphites.

Figure 6:
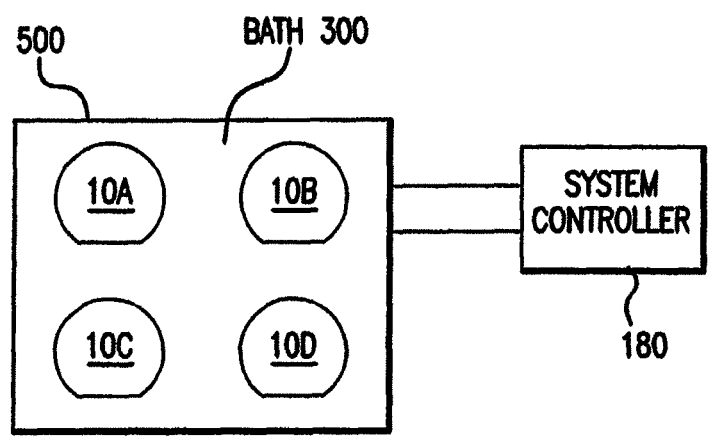
FIG. 6 is a schematic top view of a plating bath system for plating multiple wafers.

As shown in FIG. 6, the plating bath 300 and electroless deposition process can be controlled by a system controller 180. Wafers 10A-10D may be stacked, one above the other, during plating. The system controller 180 monitors the stability of the plating bath 300, and determines the rate at which to inject stabilizers, reducing agent, nickel, and chelating agents into the plating bath 300. The system controller 180 can be, for example, a computer. Typically, the amount of organic acid stabilizer is controlled by maintaining the $Ni^{2+}$ concentration in the bath. In the present invention, the concentrations of both $Ni^{2+}$ and hypophosphite salts in the bath 300 are controlled and maintained using an autotitrator that titrates their concentration via feedback control. An exemplary way of setting the stabilizer concentration is to calibrate it based on the feature size being plated.

Various stabilizers can be used in bath 300 in accordance with the present invention. Generally, stabilizers useful in the present invention can include those from the following four categories: compounds of Group VI elements, such as S, Se, and Te; compounds containing oxygen, such as $AsO_2^-$, $IO_3^-$, and $MoO_4^{2-}$; heavy metal cations such as $Sn^{2+}$, $Pb^{2+}$, $Hg^+$, and $Sb^{3+}$; and unsaturated organic acids, such as maleic acid and itaconic acid. Typically, the preferred stabilizers for the present invention are the aforementioned compounds of Group VI elements and heavy metal cations, with the heavy metal cations, and specifically Pb, being most preferred.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A plating method comprising:
   providing substrate;
   providing a first metal structure on the substrate, the first metal structure having a first surface area;
   providing a second metal structure on the substrate, the second metal structure having a second surface area, the second surface area being larger than the first surface area;
   conductively connecting the second metal structure to the first metal structure to create a conductive connection;
   plating the first metal structure and the second metal structure in an electroless bath; and
   disconnecting the conductive connection after the plating operation.

2. A plating method comprising:
   providing substrate;
   providing a first metal structure on the substrate, the first metal structure having a first surface area;
   providing a second metal structure on the substrate, the second metal structure having a second surface area, the second surface area being larger than the first surface area;
   conductively connecting the second metal structure to the first metal structure to create a conductive connection; and
   plating the first metal structure and the second metal structure in an electroless bath, the electroless bath comprising a nickel salt, a hypophosphite salt, an organic acid or a chelating agent, and a stabilizer, wherein the stabilizer is selected from the group consisting of Pb, Cd, and $CH_4N_2S$.

3. A plating method comprising:
providing substrate;
providing a first metal structure on the substrate, the first metal structure having a first surface area;
providing a second metal structure on the substrate, the second metal structure having a second surface area, the second surface area being about 400 times greater than the first surface area;
conductively connecting the second metal structure to the first metal structure to create a conductive connection; and
plating the first metal structure and the second metal structure in an electroless bath.

4. A plating method comprising:
providing substrate;
providing a first metal structure on the substrate, the first metal structure having a first surface area;
providing a second metal structure on the substrate, the second metal structure having a second surface area, the second surface area being larger than the first surface area;
conductively connecting the second metal structure to the first metal structure to create a conductive connection;
plating the first metal structure and the second metal structure in an electroless bath; and
removing the portion of the substrate on which the second metal structure and conductive connection are located.

5. A plating method comprising:
providing substrate;
providing a first metal structure on the substrate, the first metal structure having a first surface area;
providing a second metal structure on the substrate, the second metal structure having a second surface area, the second surface area being larger than the first surface area;
conductively connecting the second metal structure to the first metal structure to create a conductive connection;
plating the first metal structure and the second metal structure in an electroless bath; and
controlling the plating such that each first metal structure is plated without the occurrence of a runaway plating reaction.

6. A plating method comprising:
providing a plating bath comprising:
a nickel salt;
a hypophosphite salt;
at least one organic acid or chelating agent; and
a stabilizer selected from the group consisting of Pb, Cd, and $CH_4N_2S$;
immersing in the plating bath a substrate, the substrate comprising: a plurality of first metal structures, each first metal structure having a first surface area, and at least one second metal structure conductively connected to each of the plurality of first metal structures, the at least one second metal structure having a second surface area larger than the first surface area; and
simultaneously plating surfaces of each of the plurality of first metal structures and a surface of the at least one second metal structure.

7. The plating method of claim 6, wherein the at least one second metal structure is conductively connected to each first metal structure by a conductive connection.

8. A plating method comprising:
providing a plating bath comprising:
a nickel salt;
a hypophosphite salt;
at least one organic acid or chelating agent; and
a stabilizer selected from the group consisting of Pb, Cd, and $CH_4N_2S$;
immersing in the plating bath a substrate, the substrate comprising: a plurality of first metal structures, each first metal structure having a first surface area, and at least one second metal structure conductively connected to each of the plurality of first metal structures, the at least one second metal structure having a second surface area larger than the first surface area; and
plating the plurality of first metal structures and the at least one second metal structure.

9. The plating method of claim 8, wherein the plating bath is an electroless bath.

10. The plating method of claim 9, wherein the nickel salt is $NiSO_4$.

11. The plating method of claim 10, wherein the hypophosphite salt is $NaH_2PO_2$ or $NH_4H_2PO_2$.

12. A plating method comprising:
providing a plating bath comprising:
a nickel salt;
a hypophosphite salt;
at least one organic acid or chelating agent; and
a stabilizer;
immersing in the plating bath a substrate, the substrate comprising: a plurality of first metal structures, each first metal structure having a first surface area, and at least one second metal structure conductively connected to each of the plurality of first metal structures, the at least one second metal structure having a second surface area larger than the first surface area;
plating the plurality of first metal structures and the at least one second metal structure; and
removing the portion of the substrate on which the at least one second metal structure is located.

13. A plating method comprising:
providing a plating bath comprising:
a nickel salt;
a hypophosphite salt;
at least one organic acid or chelating agent; and
a stabilizer selected from the group consisting of Pb, Cd, and $CH_4N_2S$;
immersing in the plating bath a substrate, the substrate comprising: a plurality of first metal structures, each first metal structure having a first surface area, and at least one second metal structure conductively connected to each of the plurality of first metal structures, the at least one second metal structure having a second surface area about 400 times greater than the first surface area; and
plating the plurality of first metal structures and the at least one second metal structure.

14. A plating method comprising:
providing a plating bath comprising:
a nickel salt;
a hypophosphite salt;
at least one organic acid or chelating agent; and
a stabilizer;
immersing in the plating bath a substrate, the substrate comprising: a plurality of first metal structures, each first metal structure having a first surface area, and at least one second metal structure conductively connected to each of the plurality of first metal structures, the at least one second metal structure having a second surface area larger than the first surface area;

plating the plurality of first metal structures and the at least one second metal structure; and controlling the plating such that each first metal structure is plated without the occurrence of a runaway plating reaction.

\* \* \* \* \*